United States Patent
Lin et al.

(10) Patent No.: US 12,446,192 B2
(45) Date of Patent: Oct. 14, 2025

(54) THERMAL MODULE

(71) Applicant: ASIA VITAL COMPONENTS CO., LTD., New Taipei (TW)

(72) Inventors: Yuan-Yi Lin, New Taipei (TW); Fu-Kuei Chang, New Taipei (TW)

(73) Assignee: ASIA VITAL COMPONENTS CO., LTD., New Taipei (TW)

( * ) Notice: Subject to any disclaimer, the term of this patent is extended or adjusted under 35 U.S.C. 154(b) by 0 days.

(21) Appl. No.: 17/242,242

(22) Filed: Apr. 27, 2021

(65) Prior Publication Data

US 2022/0346276 A1    Oct. 27, 2022

(51) Int. Cl.
*H05K 7/20*  (2006.01)
*F28D 15/02* (2006.01)

(52) U.S. Cl.
CPC ..... *H05K 7/20336* (2013.01); *F28D 15/0233* (2013.01); *F28D 15/0275* (2013.01); *H05K 7/20327* (2013.01); *H05K 7/20409* (2013.01); *F28D 2015/0216* (2013.01)

(58) Field of Classification Search
CPC ......... F28D 15/0275; F28D 2015/0216; F28D 15/0233; H05K 7/20336; H01L 23/467
See application file for complete search history.

(56) References Cited

U.S. PATENT DOCUMENTS

| 7,395,851 B2 * | 7/2008 | Lee ............... H01L 23/467 257/E23.099 |
| 7,443,677 B1 * | 10/2008 | Zhou ............. H01L 23/427 361/679.48 |
| 9,273,909 B2 * | 3/2016 | Wu ................ F28D 15/04 |
| 2008/0302510 A1 | 12/2008 | Ouyang |

(Continued)

FOREIGN PATENT DOCUMENTS

| CN | 203423886 U | 2/2014 |
| CN | 206835532 U * | 1/2018 |

(Continued)

OTHER PUBLICATIONS

Search Report dated Jan. 12, 2023 issued by Taiwan Intellectual Property Office for counterpart application No. 110112559, 2 pages.
(Continued)

*Primary Examiner* — Jianying C Atkisson
*Assistant Examiner* — Khaled Ahmed Ali Al Samiri
(74) *Attorney, Agent, or Firm* — Bradley J. Thorson; DeWitt LLP

(57) ABSTRACT

A thermal module includes a base seat, at least two heat pipes and multiple heat dissipation units. Each heat pipe has a heat absorption end and a heat dissipation end outward extending from the heat absorption end. The heat absorption ends are disposed on the base seat. The heat dissipation ends of the at least two heat pipes are positioned above the base seat at different heights and misaligned from each other. The multiple heat dissipation units are connected with the heat dissipation ends of the heat pipes and arranged at intervals. By means of arranging the multiple heat dissipation unit at intervals as multiple layers, the heat dissipation areas is enlarged to prevent the airflow from being interrupted so as to effectively greatly enhance the heat dissipation efficiency.

7 Claims, 6 Drawing Sheets

(56) References Cited

U.S. PATENT DOCUMENTS

| | | | | |
|---|---|---|---|---|
| 2009/0266518 A1* | 10/2009 | Huang | ................ | F28D 15/0275 |
| | | | | 165/104.19 |
| 2012/0222839 A1* | 9/2012 | Huang | ................ | F28D 15/0275 |
| | | | | 165/104.26 |
| 2015/0043167 A1* | 2/2015 | Guenin | ................ | H01L 23/427 |
| | | | | 361/719 |
| 2020/0355443 A1* | 11/2020 | Tochigi | ................ | F28D 15/025 |

FOREIGN PATENT DOCUMENTS

| | | | |
|---|---|---|---|
| CN | 214627800 U | | 11/2021 |
| JP | 2001267773 A | * | 9/2001 |
| TW | M249410 U | | 11/2004 |
| TW | M252255 U | | 12/2004 |
| TW | M267513 U | | 6/2005 |
| TW | M308442 U | | 3/2007 |
| TW | 200829148 A | | 7/2008 |
| TW | M342543 U | | 10/2008 |
| WO | 2004027590 A1 | | 4/2004 |

OTHER PUBLICATIONS

Search Report dated Nov. 11, 2024 issued by China National Intellectual Property Administration for counterpart application No. 2021103737378, 3 pages.

\* cited by examiner

THERMAL MODULE

BACKGROUND OF THE INVENTION

1. Field of the Invention

The present invention relates generally to a thermal module, and more particularly to a thermal module, which can prevent the airflow from being interrupted and enlarge heat dissipation areas so as to effectively enhance heat dissipation efficiency.

2. Description of the Related Art

The performance of many electronic devices (such as computers) has been increasingly enhanced so that the electronic components in the electronic device will generate very high heat. The heat must be dissipated by means of a heat sink so as to lower the temperature for keeping the working efficiency and minifying the possibility of damage of the electronic components. existent heat sinks can be classified into two types, one of which is composed of aluminum extrusion radiating fins, while the other of which is composed of stacked radiating fins connected with each other by means of lap joint. The gaps between each two adjacent radiating fins and the heights of the radiating fins of the heat sink are fixed and unified so that the airflow passing through the upper side and lower side of all the radiating fins and the gap between the radiating fins is limited and unified and the flow lengths of the airflow passing through the radiating fins are equal. In this case, when the conventional heat sink contacts and is attached to a heat source (such as a central processing unit or a graphics processing chip) for conducting the heat and the radiating fins of the heat sink outward dissipate the heat by way of radiation, the flow amount of the airflow blowing to the upper and lower sides of the radiating fins is limited and unified. As a result, the heat carried away is limited. This will lead to the problem of heat accumulation.

Along with the enhancement of the wattage and performance of the electronic components, the number and the height of the radiating fins of the conventional heat sink must be increased so as to enlarge the heat dissipation area. However, only the heat sink with the same area can be arranged in the limited internal space of the electronic device. For achieving larger heat dissipation area, it is necessary increase the number of the radiating fins. For example, in a 10 cm×10 cm area, the more the number of the radiating fins is, the narrower the gap (the airflow passage) between the adjacent radiating fins is, (that is, the gap between two adjacent radiating fins will be minified). In this case, the resistance (flow field impedance) against the airflow flowing through the radiating fins is enlarged and the air volume entering the gap between the radiating fins will be greatly reduced. This will lead to poor heat dissipation efficiency. In the case that the height or the length of the radiating fins is increased, the thickness of the radiating fins is so thin that the radiating fins are apt to deform or damage due to collision. In the case that the thickness of the radiating fins is increased, the number of the radiating fins will be reduced. This leads to the problem of decrease of the heat dissipation area.

Therefore, it is critical how to utilize the space above the heat sink to increase heat dissipation area in the limited space with the same area of the heat sink. Some manufacturers employ two independent heat sinks, which are directly stacked as two layers or assembled by means of lap joint so as to achieve larger heat dissipation area. However, this leads to another problem. One heat sink is directly overlaid on another heat sink to abut against and press the radiating fins thereof. The considerable weight of the upper heat sink overlaid on the lower heat sink will apply a pressure to the radiating fins of the lower heat sink. The radiating fins of the lower heat sink can hardly bear the weight of the upper heat sink so that the radiating fins of the lower heat sink are apt to deform (or damage). This will lead to poor heat dissipation efficiency. Therefore, the problem of structural strength of the radiating fins can be hardly solved.

It is therefore tried by the applicant to provide a thermal module to solve the problems and shortcomings existing in the conventional heat sink.

SUMMARY OF THE INVENTION

It is therefore a primary object of the present invention to provide a thermal module, which can increase the heat dissipation area and prevent the airflow from being interrupted so as to effectively enhance heat dissipation efficiency.

To achieve the above and other objects, the thermal module of the present invention includes a base seat, at least two heat pipes and multiple heat dissipation units. Each heat pipe has a heat absorption end and a heat dissipation end outward extending from the heat absorption end. The heat absorption ends are disposed on the base seat. The heat dissipation ends of the at least two heat pipes are positioned above the base seat at different heights and misaligned from each other. The multiple heat dissipation units are connected with the heat dissipation ends of the heat pipes and arranged at intervals.

Still to achieve the above and other objects, the thermal module of the present invention thermal module includes a base seat, at least one heat pipe and at least one heat dissipation unit. The base seat has a top side and a bottom side. Multiple base seat radiating fins are disposed on the top side. The at least one heat pipe has a heat absorption end and a heat dissipation end outward extending from the heat absorption end. The heat absorption end is disposed on the base seat. The base seat and the heat dissipation end positioned above the base seat are arranged at different heights. The heat dissipation unit is spaced from the multiple base seat radiating fins by a gap.

Therefore, by means of arranging the multiple radiating fins at intervals as multiple layers and misaligning the multiple radiating fins, the positions of the multiple radiating fins arranged on the higher or lower or front and rear sides or the positions of the multiple radiating fins relative to the multiple base seat radiating fins can be adjusted. This not only can enlarge the heat dissipation area, but also can prevent the airflow from being interrupted so as to effectively enhance the heat dissipation efficiency.

In the above thermal module, the base seat has a top side and a bottom side. The bottom side of the base seat has multiple channels. The heat absorption ends of the heat pipes are received and connected in the multiple channels. The heat absorption ends of the heat pipes are flush with the bottom side of the base seat.

In the above thermal module, an upper side of the heat absorption ends of the at least two heat pipes is attached to the bottom side of the base seat, while a lower side of the heat absorption end of at least one of the at least two heat pipes is attached to a heat generation component.

In the above thermal module, each heat dissipation unit has multiple radiating fins. Each two adjacent radiating fins define therebetween an airflow passage. The airflow passages of the multiple radiating fins on the heat dissipation ends of the at least two heat pipes are identical to each other or different from each other.

In the above thermal module, the base seat is a vapor chamber, a heat plate, a heat conduction block or a heat sink.

In the above thermal module, the width of the airflow passages of the multiple radiating fins on the heat dissipation end of the at least one heat pipe is larger than, equal to or smaller than the width of the airflow passages of the multiple radiating fins on the heat dissipation end of the other at least one heat pipe.

The above thermal module further includes at least one fan. The fan is selectively disposed on one side of the base seat or one side of the multiple radiating fins or positioned at the middle for guiding an airflow to flow to the multiple radiating fins for heat exchange.

In the above thermal module, the heat dissipation ends of the at least two heat pipes are positioned above the base seat and arranged on front and rear sides and misaligned from each other.

In the above thermal module, the heat dissipation unit includes multiple radiating fins and a two-phase fluid heat dissipation structure. One side of the multiple radiating fins is attached to an upper side of the two-phase fluid heat dissipation structure. The heat dissipation end of the heat pipe is in contact with a lower side of the two-phase fluid heat dissipation structure or in direct communication and connection with a chamber of the two-phase fluid heat dissipation structure.

In the above thermal module, the two-phase fluid heat dissipation structure is a vapor chamber or a heat plate.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
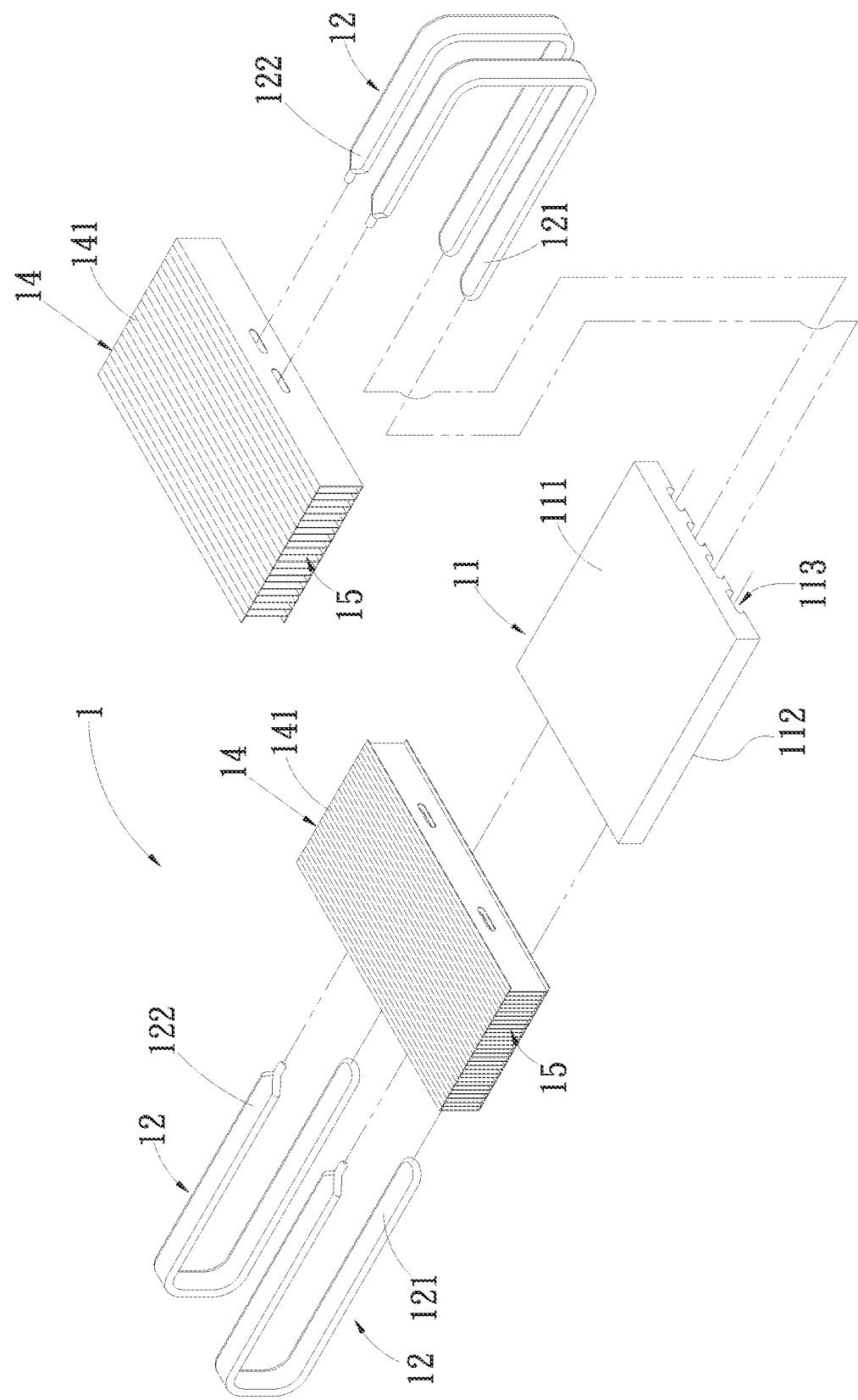
FIG. 1 is a perspective exploded view of a preferred embodiment of the present invention.
Figure 2:
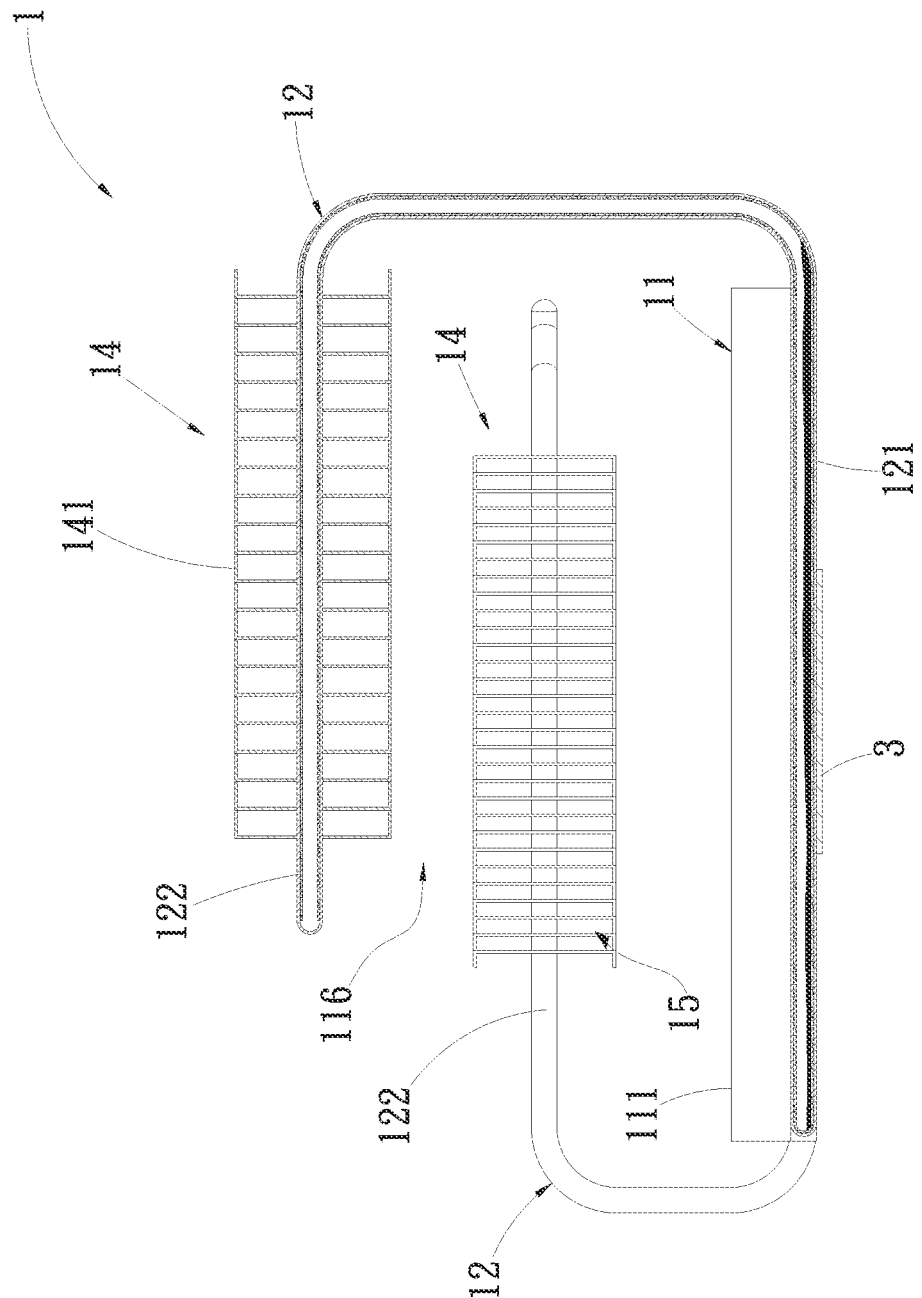
FIG. 2 is a sectional assembled view of the preferred embodiment of the present invention.

The present invention provides a thermal module. Please refer to FIGS. 1 and 2. The thermal module 1 includes a base seat 1, at least two heat pipes 12 and multiple heat dissipation units 14. The base seat 11 can be selectively a vapor chamber, a heat plate, a heat conduction block or a heat sink. In this embodiment, the base seat 11 is selectively, but not limited to, a heat conduction block made of metal material (such as copper, aluminum, titanium, stainless steel or alloy material) for illustration purposes. The base seat 11 has a top side 111, a bottom side 112 and multiple channels 113. The multiple channels 113 are recessed and formed on the bottom side 112 of the base seat 11. A heat absorption end 121 of the heat pipe 12 is received and connected in each of the multiple channels 113. Each heat pipe 12 has the heat absorption end 121 and a heat dissipation end 122 outward extending from the heat absorption end 121. The heat absorption end 121 is disposed on the bottom side 112 of the base seat 11 and flush with the bottom side 112 of the base seat 11. Each channel 113 has a configuration in adaptation to the configuration of each heat pipe 12. In a preferred embodiment, the channels 113 are omitted and the heat absorption ends 121 of the multiple heat pipes 12 are directly connected in the base seat 11. Alternatively, the heat absorption ends 121 of the multiple heat pipes 12 are selectively disposed and attached to the top side 111 or the bottom side 112 of the base seat 11 in contact therewith.

In a modified embodiment, the base seat 11 has a chamber (such as a vapor chamber or a heat plate, not shown) for vapor-liquid phase change. The heat absorption ends 121 of the multiple heat pipes 12 are connected with the chamber in communication therewith or not in communication therewith.

Figure 3A:
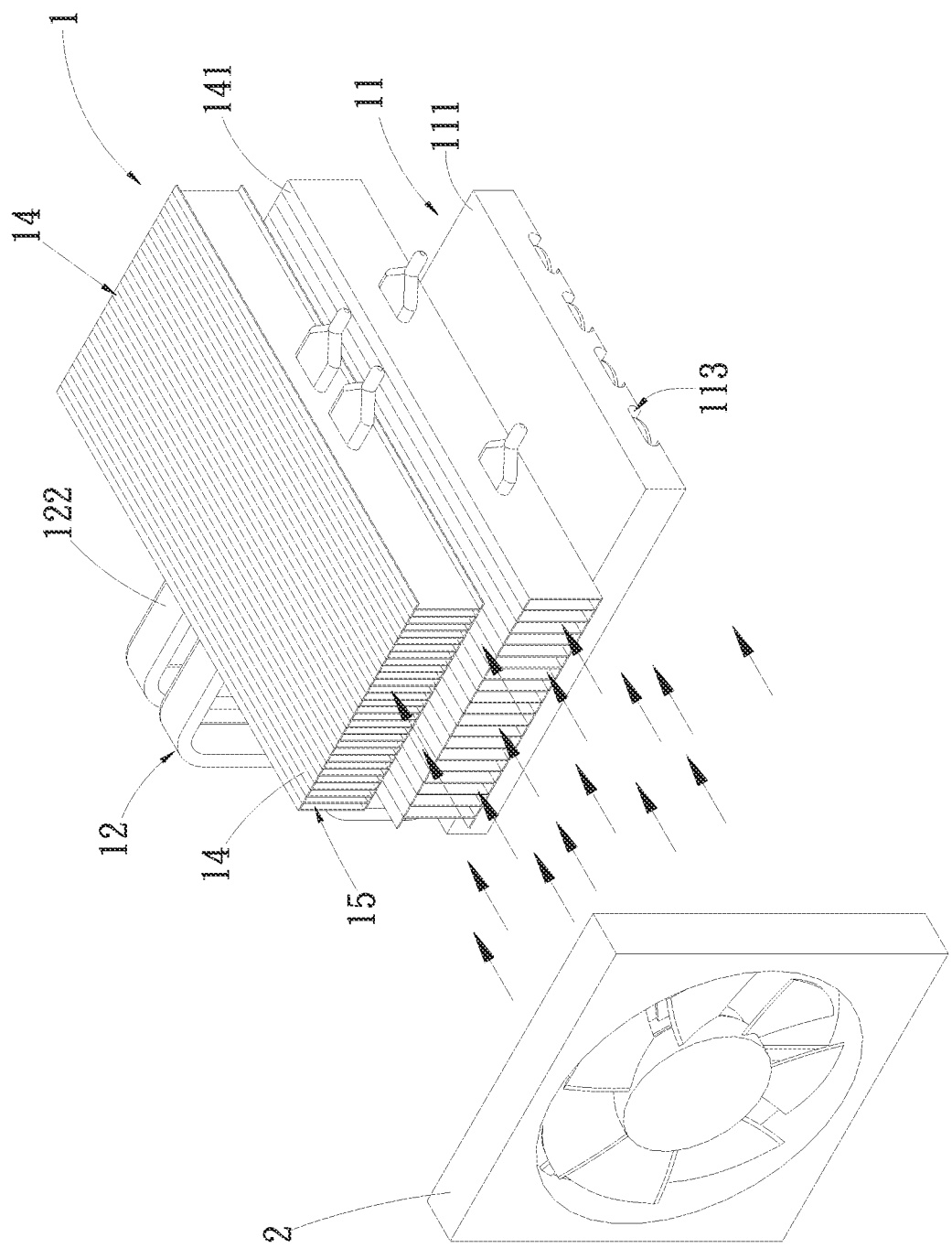
FIG. 3A is a perspective view of the present invention, showing that the thermal module of the present invention further includes a fan for blowing wind to the heat dissipation units.
Figure 4:
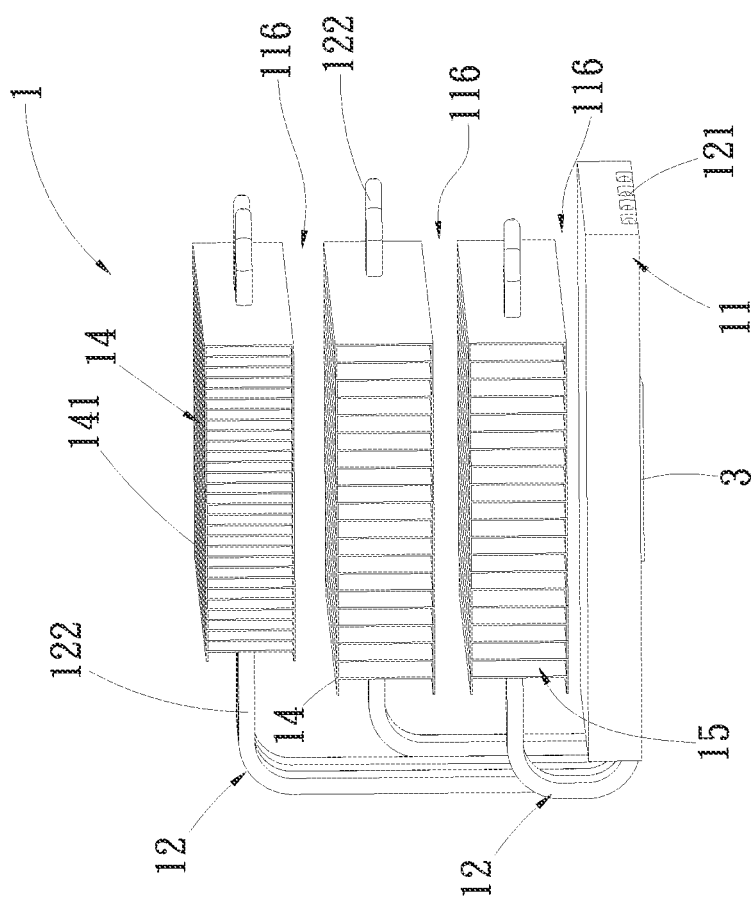
FIG. 4 is a perspective assembled view of a modified embodiment of the present invention.

The heat dissipation ends 122 of the at least two heat pipes 12 are positioned above the top side 111 of the base seat 11 respectively on a higher level and a lower level and misaligned from each other. In this embodiment, the multiple heat pipes 12 are, but not limited to, disposed on opposite sides of the base seat 11. In practice, the number of the heat pipes 12 can be more than two and the heat pipes 12 are disposed on the same side (as shown in FIGS. 3A and 4) or different sides of the base seat 11. In addition, the heat dissipation ends 122 of the multiple heat pipes 12 are positioned above the top side 111 of the base seat 11 and arranged at intervals as multiple layers on higher and lower levels and/or on front and rear sides and misaligned from each other. An upper side of the heat absorption end 121 of each of the multiple heat pipes 12 is attached to the bottom side 112 of the base seat 11 in contact therewith. A lower side of the heat absorption end 121 of two of the multiple heat pipes 12 is directly attached to a heat generation component 3 (such as a central processing unit or a graphics processing unit or single chip or other electronic component) in contact therewith. The heat dissipation ends 122 of the two heat pipes 12 of the multiple heat pipes 12 are termed as two heat dissipation ends 122 of upper layer (higher layer) for short, while the heat dissipation ends 122 of the other two heat pipes 12 of the multiple heat pipes 12 are termed as two heat dissipation ends 122 of lower layer (lower layer) for short.

The multiple heat dissipation units 14 are connected with the heat dissipation ends 122 of the multiple heat pipes 12 (such as the two heat dissipation ends 122 of upper layer and the two heat dissipation ends 122 of lower layer. In addition, the multiple heat dissipation units 14 are arranged at intervals. Each heat dissipation unit 14 includes multiple radiating fins 141. Each two adjacent radiating fins 14 define therebetween an airflow passage 15. The airflow passage 15 serves to guide an external airflow into the heat dissipation units 14 to carry away more heat of the heat dissipation units 14 for heat exchange. The multiple heat dissipation units 14 of lower layer are respectively spaced from the heat dissipation units 14 of upper layer and the base seat 11 by a gap 116. The gap 116 is for the external airflow (such as natural convection or forced convection) to pass through the multiple radiating fins 141 of the heat dissipation units 14 so as to prevent the airflow from being interrupted and enhance heat exchange efficiency.

The airflow passages 15 of the multiple radiating fins 141 of the respective heat dissipation units 14 are identical to each other or different from each other.

In this embodiment, the airflow passages 15 of the heat dissipation unit 14 on the heat dissipation ends 122 of upper layer are selectively different from the airflow passages 15 of the heat dissipation unit 14 on the two heat dissipation ends 122 of lower layer. That is, the width of the airflow passages 15 of the multiple radiating fins 141 of the upper layer heat dissipation unit 14 is larger than the width of the airflow passages 15 of the multiple radiating fins 141 of the lower layer heat dissipation unit 14. In this embodiment, the number of the radiating fins 141 on the hotter lower layer is more than the upper layer. Therefore, the airflow passages 15 between the radiating fins 141 of the lower layer are narrower, while the airflow passages 15 between the radiating fins 141 of the upper layer are wider, whereby the airflow can quickly pass through to increase the flow amount of the entering airflow. By means of such design, the flow field of the passing airflow can be changed to enhance or guide the airflow to more smoothly perform heat exchange with the heat dissipation unit. In addition, no matter whether the width of the airflow passages 15 between the radiating fins 141 is increased to enhance the flow amount of the entering airflow or the width of the airflow passages 15 between the radiating fins 141 is reduced to increase the number of the arranged radiating fins 141 in return so as to increase the heat dissipation area, the heat exchange efficiency can be effectively enhanced in both situations. Moreover, in the present invention, the heat dissipation units 14 on the upper and lower layers can provide various design combinations. In contrast, both the passage between the radiating fins and the number of the radiating fins of the conventional heat sink are fixed without possibility of change. Therefore, the design of the present invention provides more flexible options of arrangement of the radiating fins.

Therefore, the thermal module 1 of the present invention is such designed as to employ the upper space to increase the heat dissipation area. The multiple heat dissipation units 14 are arranged above the base seat in layers at height intervals, (that is, height difference) so as to increase the number of the radiating fins 141 for enlarging the heat dissipation area. In addition, the multiple heat dissipation units 14 are such designed as to be positioned on a higher level and a lower level and misaligned from each other (such as positioned on front and rear sides or left and right sides and misaligned from each other) to prevent the airflow from being interrupted and effectively increase the flow amount passing through the radiating fins 141 and enhance the heat dissipation performance of the entire thermal module 1. In addition, the thermal module 1 of the present invention is applicable to an electronic device (such as a compute, a communication device or a server, not shown) so as to provide better heat dissipation effect for the heat generation component 3 in the electronic device in limited space.

In a modified embodiment, the width of the airflow passages 15 of the multiple radiating fins 141 of the upper layer (higher layer) heat dissipation unit 14 is smaller than or equal to the width of the airflow passages 15 of the multiple radiating fins 141 of the lower layer (lower layer) heat dissipation unit 14. In another modified embodiment, the multiple heat dissipation units 14 (such as the upper layer heat dissipation units 14 and/or the lower layer heat dissipation units 14) are selectively disposed on the full heat dissipation ends 122 of the heat pipes 12 (such as the heat dissipation ends 122 of the upper layer and/or the heat dissipation ends 122 of the lower layer) or disposed on anyone of the front, middle and rear sections of the heat dissipation ends 122 or any two of the front, middle and rear sections of the heat dissipation ends 122 and arranged in sections. In still another modified embodiment, the bottom sides of the multiple heat dissipation units 14 (such as the upper layer heat dissipation units 14 and/or the lower layer heat dissipation units 14) are attached to the upper side of a vapor chamber (or a heat plate) and the heat dissipation ends 122 of the heat pipes 12 (such as the heat dissipation ends 122 of the upper layer and/or the heat dissipation ends 122 of the lower layer) are connected with the lower side of a vapor chamber (or a heat plate).

Figure 3B:
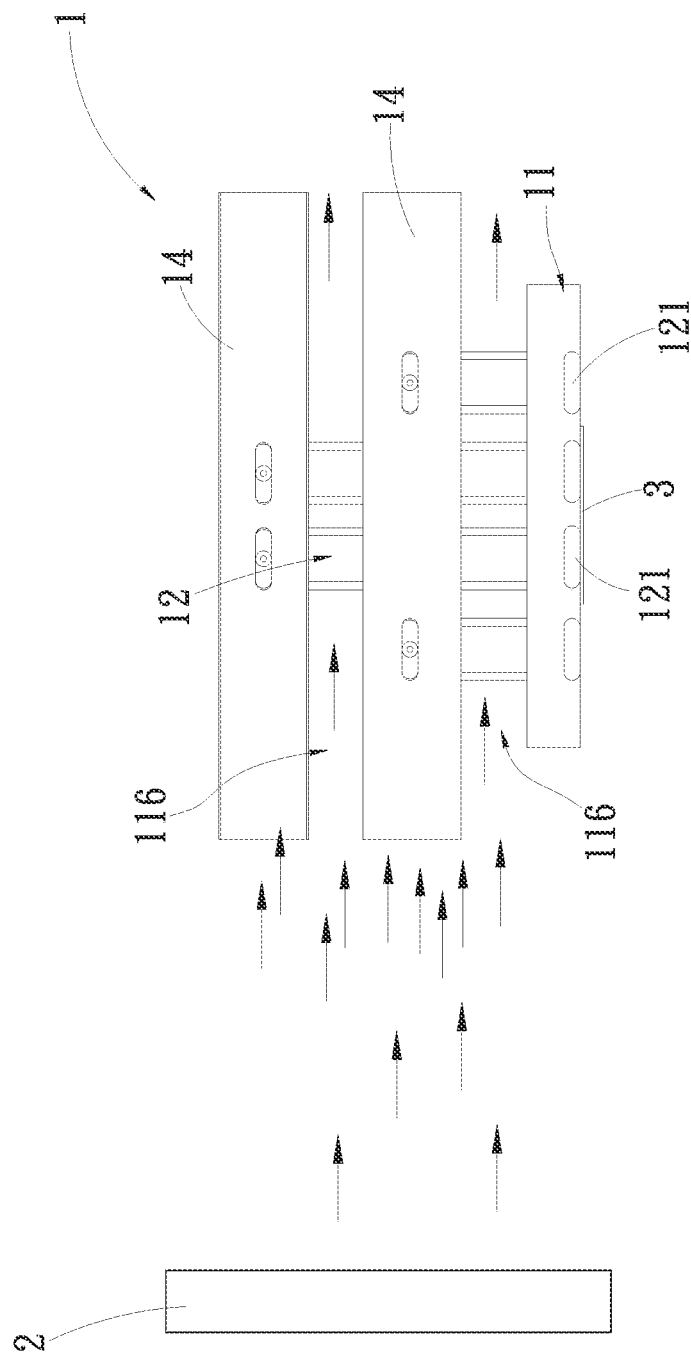
FIG. 3B is a schematic diagram showing that the flow amounts of the airflows blown from the fan to the multiple radiating fins of higher and lower layers are different from each other.

Please refer to FIGS. 3A and 3B. In a modified embodiment of the present invention, the thermal module 1 further includes at least one fan 2 (such as an axial-flow fan or a centrifugal fan). The fan 2 is selectively disposed on one side of the base seat 11 or one side of the multiple radiating fins 141 or positioned at the middle for guiding airflow to flow to the multiple radiating fins 141 for heat exchange so as to achieve forced heat dissipation. In this modified embodiment, the fan 2 is disposed on one side of the base seat 11. A wind outlet of the fan 2 is directed to the airflow passages 15 of the multiple radiating fins 141 of the upper and lower layers (higher and lower layers) to blow airflow thereto. The flow resistance (flow field impedance) of the airflow flowing through the multiple radiating fins 141 of the upper layer (higher layer) is, but not limited to, greater than the flow resistance (flow field impedance) of the airflow flowing through the multiple radiating fins 141 of the lower layer (lower layer). In another modified embodiment, the flow resistance (or heat dissipation area) of the airflow flowing through the multiple radiating fins 141 of the upper layer is smaller than the flow resistance (or heat dissipation area) of the airflow flowing through the multiple radiating fins 141 of the lower layer.

Figure 5:
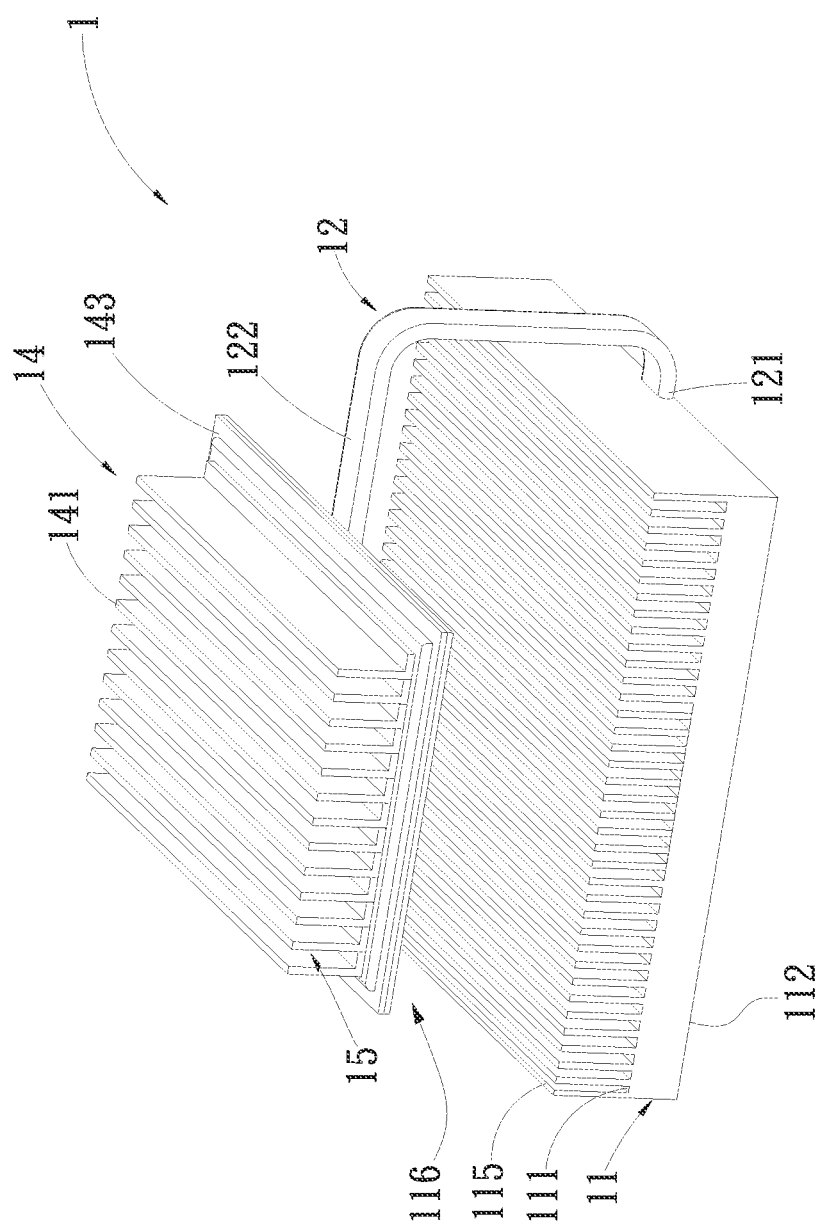
FIG. 5 is a perspective assembled view of another modified embodiment of the present invention.

Please refer to FIG. 5. In still another modified embodiment, the base seat 11 further includes multiple base seat radiating fins 115. The multiple base seat radiating fins 115 are integrally disposed on the top side 111 of the base seat 11 to form a heat sink. In this modified embodiment, the heat pipe 12 and the heat dissipation unit 14 are selectively one single heat pipe 12 and one single heat dissipation unit 14 for illustration. The base seat 11 and the multiple base seat radiating fins 115 thereon and the heat dissipation end 122 of the heat pipe 12 above the base seat 11 and the heat dissipation unit 14 on the heat dissipation end 122 are arranged at different heights at intervals. In addition, the heat dissipation unit 14 and the multiple base seat radiating fins 115 are spaced from each other by another gap 116. The heat dissipation unit 14 further includes a two-phase fluid heat dissipation structure 143 (such as a vapor chamber or a heat plate). One side of the multiple radiating fins 141 is attached to an upper side of the two-phase fluid heat dissipation structure 143. The heat dissipation end 122 of the heat pipe 12 is in contact with a lower side of the two-phase fluid heat dissipation structure 143. Alternatively, the heat dissipation end 122 of the heat pipe 12 is in direct communication and connection with the chamber of the two-phase fluid heat dissipation structure 143. Therefore, by means of arranging the heat dissipation unit 14 and the multiple base seat radiating fins 115 at intervals as two layers, the heat dissipation areas and the flow resistance of the airflow of the higher layer and the lower layer can be adjusted so as to effectively enlarge the heat dissipation area and prevent the airflow from being interrupted for effectively enhancing the heat dissipation efficiency.

The present invention has been described with the above embodiments thereof and it is understood that many changes and modifications in such as the form or layout pattern or practicing step of the above embodiments can be carried out without departing from the scope and the spirit of the invention that is intended to be limited only by the appended claims.

What is claimed is:

1. A thermal module comprising:
a base seat;
at least two U-shaped heat pipes, each of the at least two U-shaped heat pipes having a heat absorption end and a heat dissipation end extending from the heat absorption end, the heat absorption ends of the at least two U-shaped heat pipes being disposed on the base seat, the heat dissipation ends of the at least two U-shaped heat pipes extending parallel with each other, one of the heat dissipation ends being vertically positioned above the base seat at a first height relative to the base seat and the other one of the heat dissipation ends being vertically positioned above the base seat at a second height relative to the base seat, the first height being unequal to the second height, wherein the heat dissipation ends of the at least two U-shaped heat pipes are misaligned from each other; and
multiple heat dissipation units, each one of the multiple heat dissipation units being suspended, and connected with a separate one of the heat dissipation ends of the at least two U-shaped heat pipes such that each heat pipe of the at least two U-shaped heat pipes penetrates a respective heat dissipation unit of the multiple heat dissipation units, a first one of the multiple heat dissipation units being disposed at the first height above and at least partially vertically overlapping the base seat, and a second one of the multiple heat dissipation units being disposed at the second height above and at least partially vertically overlapping the base seat, wherein a first vertical gap spaces the first heat dissipation unit and the base seat and a second vertical gap spaces the first heat dissipation unit and the second heat dissipation unit, so that the multiple heat dissipation units are not connected to each other, and by means of the first vertical gap and the second vertical gap, external airflow can pass through the multiple heat dissipation units for dissipating heat and preventing the airflow from being interrupted, wherein each heat dissipation unit has multiple radiating fins, each two adjacent radiating fins defining therebetween an airflow passage, the airflow passages of the multiple radiating fins on the heat dissipation ends of the at least two U-shaped heat pipes having different widths from each other.

2. The thermal module as claimed in claim 1, wherein the base seat has a top side and a bottom side, the bottom side of the base seat having multiple channels, the heat absorption ends of the at least two U-shaped heat pipes being received and connected in the multiple channels, the heat absorption ends of the at least two U-shaped heat pipes being flush with the bottom side of the base seat.

3. The thermal module as claimed in claim 1, wherein an upper side of the heat absorption ends of the at least two U-shaped heat pipes is attached to a bottom side of the base seat, and at least one of the at least two U-shaped heat pipes has a lower side of the heat absorption end attached to a heat generation component.

4. The thermal module as claimed in claim 1, wherein the base seat is a vapor chamber, a heat plate, a heat conduction block or a heat sink.

5. The thermal module as claimed in claim 1, wherein a width of the airflow passages of the multiple radiating fins on the heat dissipation end of one of the at least two U-shaped heat pipes is larger than, equal to or smaller than a width of the airflow passages of the multiple radiating fins on the heat dissipation end of the other of the at least two U-shaped heat pipes.

6. The thermal module as claimed in claim 1, further comprising at least one fan, the fan being selectively disposed on one side of the base seat or one side of the multiple radiating fins or positioned at the middle for guiding an airflow to flow to the multiple radiating fins for heat exchange.

7. The thermal module as claimed in claim 1, wherein the heat dissipation ends of the at least two U-shaped heat pipes are arranged on front and rear sides of the multiple heat dissipation units.

* * * * *